(12) United States Patent
Zhang

(10) Patent No.: US 9,502,446 B2
(45) Date of Patent: Nov. 22, 2016

(54) POLY-SILICON TFT, POLY-SILICON ARRAY SUBSTRATE AND PREPARING METHOD THEREOF, DISPLAY DEVICE

(71) Applicant: BOE TECHNOLOGY GROUP CO., LTD., Beijing (CN)

(72) Inventor: Fangzhen Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/985,336

(22) PCT Filed: Nov. 16, 2012

(86) PCT No.: PCT/CN2012/084780
§ 371 (c)(1),
(2) Date: Aug. 14, 2013

(87) PCT Pub. No.: WO2014/019300
PCT Pub. Date: Feb. 6, 2014

(65) Prior Publication Data
US 2014/0077216 A1    Mar. 20, 2014

(30) Foreign Application Priority Data
Jul. 31, 2012  (CN) .......................... 2012 1 0270680

(51) Int. Cl.
*H01L 27/14*    (2006.01)
*H01L 29/04*    (2006.01)
(Continued)

(52) U.S. Cl.
CPC ......... *H01L 27/127* (2013.01); *H01L 27/1222* (2013.01); *H01L 29/66757* (2013.01); *H01L 29/78618* (2013.01)

(58) Field of Classification Search
CPC ...................................................... H01L 21/336
USPC ............................ 257/59; 438/148, 151, 164
See application file for complete search history.

(56) References Cited

U.S. PATENT DOCUMENTS 5,198,379 A * 3/1993 Adan ................ H01L 29/66477
                                                257/E21.409
6,635,521 B2 * 10/2003 Zhang ................ H01L 27/1214
                                                257/E27.111

(Continued)

FOREIGN PATENT DOCUMENTS

CN     1542948 A    11/2004
CN     1693972 A    11/2005

(Continued)

OTHER PUBLICATIONS

International Search Report dated Apr. 10, 2013; PCT/CN2012/084780.

(Continued)

*Primary Examiner* — Mohsen Ahmadi
*Assistant Examiner* — Ismail Muse
(74) *Attorney, Agent, or Firm* — Ladas & Parry LLP

(57) ABSTRACT

Provided are a poly-silicon thin film transistor (TFT), a poly-silicon array substrate and a preparing method thereof, and a display device for solving the problems of excessive mask plates, complicated process and high costs in a conventional technology. The method of preparing the poly-silicon TFT comprising a doped region comprises steps: forming a poly-silicon layer on a substrate, forming an active layer by a patterning process; forming a first insulating layer; forming, by a patterning process, via holes exposing the active layer, the source electrode and the drain electrode being connected through the via holes to the active layer; doping the active layer through the via holes by a doping process to form a doped region; forming a source-drain metal layer, and forming the source electrode and the drain electrode by a patterning process.

20 Claims, 5 Drawing Sheets

(51) Int. Cl.

| | | |
|---|---|---|
| *H01L 29/15* | (2006.01) | |
| *H01L 31/036* | (2006.01) | |
| *H01L 27/12* | (2006.01) | |
| *H01L 29/66* | (2006.01) | |
| *H01L 29/786* | (2006.01) | |

(56) References Cited

U.S. PATENT DOCUMENTS

| | | | |
|---|---|---|---|
| 7,176,074 B1 * | 2/2007 | Shiau | H01L 21/31144 257/E21.257 |
| 2002/0066901 A1 * | 6/2002 | Yamanaka | G02F 1/13454 257/59 |
| 2004/0175868 A1 * | 9/2004 | Luo | H01L 27/1214 438/148 |
| 2004/0197967 A1 * | 10/2004 | Chen | H01L 27/1214 438/154 |
| 2006/0121636 A1 | 6/2006 | Yang | |
| 2006/0290828 A1 * | 12/2006 | Hwang | H01L 27/3244 349/43 |
| 2008/0299693 A1 | 12/2008 | Toyota et al. | |
| 2012/0171822 A1 | 7/2012 | Yuan et al. | |
| 2012/0178196 A1 | 7/2012 | Park et al. | |
| 2012/0193624 A1 * | 8/2012 | You | H01L 27/124 257/57 |

FOREIGN PATENT DOCUMENTS

| | | |
|---|---|---|
| JP | 2003-115498 A | 4/2003 |
| TW | 587309 B | 5/2004 |

OTHER PUBLICATIONS

First Chinese Office Action dated May 19, 2014; Appln. No. 201210270680.X.
Second Chinese Office Action dated Nov. 15, 2014; Appln. No. 20141107000705650.
International Preliminary Report on Patentability dated Feb. 3, 2015; Appln. No. PCT/CN2012/084780.
Chinese Rejection Decision dated Feb. 6, 2015; Appln. No. 201210270680.X.
Extended European Search Report dated Feb. 29, 2016; Appln. No. 12867729.1-1504 / 2881993 PCT/CN2012084780.

* cited by examiner

POLY-SILICON TFT, POLY-SILICON ARRAY SUBSTRATE AND PREPARING METHOD THEREOF, DISPLAY DEVICE

TECHNICAL FIELD

Embodiments of the present invention relate to a poly-silicon TFT, a poly-silicon array substrate and a preparing method thereof, and a display device.

BACKGROUND

With such characteristics as small volume, low power consumption and less manufacturing costs, thin film transistor liquid crystal displays (TFT-LCDs) have dominated the current market of flat panel displays.

As for the TFT using low temperature poly-silicon (LIPS) as an active layer, the costs and defective ratio may be further lowered due to higher mobility and other advantages of LIPS, and the performance of the TFT can be improved. In the conventional technology, however, exposure and development processes of at least 7-9 times are required during the preparation of an LIPS-TFT in order to ensure good performance of N-type and P-type LTPS-TFT to be prepared. In this case, the processes for preparing the LTPS-TFT are increased, and so are the numbers of mask plates to be needed, which leads to complicated processes and high costs.

SUMMARY

Embodiments of the present invention provide a poly-silicon TFT, a poly-silicon array substrate and a preparing method thereof, which have simplified process and lower costs.

One embodiment of the present invention provides a method of preparing a poly-silicon TFT which comprises a doped region, the method comprising the following steps: forming a poly-silicon layer on a substrate, forming an active layer by a patterning process; forming a first insulating layer covering the active layer; forming, by a patterning process, via holes exposing the active layer in the first insulating layer at preset positions for forming a source electrode and a drain electrode in subsequent steps; doping the active layer through the via holes by a doping process to form a doped region; forming a source-drain metal layer, and forming the source electrode and the drain electrode by a patterning process.

For example, the aforesaid method of preparing poly-silicon TFT may further comprise: forming a gate metal layer, forming a gate electrode by a patterning process; foaming a second insulating layer on the substrate where the gate electrode is formed.

In the method, for example, the poly-silicon TFT is an N-TFT, and the doped region may be an N-type doped region.

In the method, for example, the doped elements may be one of P, As, and Sb, or a mixture thereof.

In the method, for example, the poly-silicon TFT may be a P-TFT, and the doped region may be a P-type doped region.

In the method, for example, the doped elements may be one of B, and In, or a mixture thereof.

Another embodiment of the present invention provides a poly-silicon TFT obtained by the aforesaid preparing method.

A further embodiment of the present invention provides a poly-silicon array substrate, which comprises the aforesaid poly-silicon TFT.

A further embodiment of the present invention provides a method of preparing a poly-silicon array substrate which comprises an N-TFT including an N-type doped region and a P-TFT including a P-type doped region, the method comprising the following steps: forming a poly-silicon layer on a substrate, forming an active layer by a patterning process, doping the N-TFT or P-TFT active layer by a first doping process to form the N-type doped region or the P-type doped region; forming a first insulating layer covering the active layer; forming, by a patterning process, via holes in the first insulating layer at preset positions for forming source and drain electrodes of the N-TFT and source and drain electrodes of the P-TFT in subsequent steps; doping an exposed active layer region via the via holes by a second doping process, to form the P-type doped region or the N-type doped region, the element doping amount of the second doping process being smaller than that of the first doping process; forming a source-drain metal layer, and forming the source electrode and the drain electrode by a patterning process.

For example, the preparing method may further comprise: forming a gate metal layer, forming a gate electrode by a patterning process; forming a second insulating layer on the substrate where the gate electrode is formed.

In the method, for example, the element doping amount of the second doping process may be ⅓~⅔ of the element doping amount of the first doping process.

In the method, for example, the element doping amount of the second doping process may be ½ of the element doping amount of the first doping process.

In the method, for example, the patterning process includes a half-tone masking process, a grey-tone masking process, or a single-slit masking process in the steps of forming the poly-silicon layer on the substrate, forming the active layer by the patterning process, doping the N-TFT or P-TFT active layer by the first doping process to form the N-type doped region or the P-type doped region.

For example, the aforesaid method may further comprise: forming a third insulating layer, and forming, by a patterning process, via holes at positions where the pixel electrode is connected to the drain electrode of the TFT in the subsequent steps.

For example, the aforesaid method may further comprise: forming a transparent conductive layer, and forming a pixel electrode by a patterning process.

The method, for example, may further comprise forming a buffer layer on the substrate prior to forming the poly-silicon layer.

In the method, for example, the doped elements in the N-type doped region of the N-TFT may be one of P, As, and Sb, or a mixture thereof.

In the method, for example, the doped elements in the P-type doped region of the P-TFT may be one of B, and In, or a mixture thereof.

A further embodiment of the present invention provides a poly-silicon array substrate obtained by the aforesaid preparing method.

A further embodiment of the present invention provides a display device, which comprises the aforesaid poly-silicon array substrate.

The poly-silicon TFT, the poly-silicon array substrate and the preparing method thereof are provided in the embodiments of the present invention by performing the doping process through via holes to form doped regions on both sides of the active layer and to form a corresponding TFT, thereby avoiding the requirement of dedicated mask plates for doping process, reducing the numbers of mask plates used for preparing the TFT array substrate, and lowering production costs.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
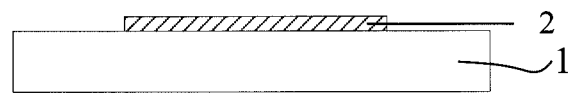
FIG. 1 to FIG. 7 are cross-sectional schematic views of the poly-silicon TFT in each of the steps provided in an embodiment of the present invention.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, the technical or scientific terms used herein shall have the general meanings understandable for those ordinarily skilled in the field of the present invention. The terms "first", "second" . . . and the like in the description and in the claims, if any, are used for distinguishing between similar elements and not necessarily for describing any order, number or priority. The phrases such as "a", "an," "the" or similar shall not represent limitation of numbers, but mean existence of at least one. The phrases "include", "comprise" or similar intend to mean the elements or objects before such words cover or are equivalent to the elements or objects listed after such words, but other elements or objects are not exclusive. The phrases "joint", "connect" or similar are not limited to physical or chemical connection, but also include electrical connection, no matter directly or indirectly. The phrases "on", "under", "left", "right" and etc. shall be used only to represent relative positions, wherein, when the absolute position of the described object is changed, the relative positions may be changed accordingly.

Embodiment 1

The present embodiment provides a method of preparing a poly-silicon TFT, which comprises the following steps.

S1. Forming a poly-silicon layer on the substrate, and forming an active layer by a patterning process.

The patterning process is, for example, a photolithography patterning process, for example comprising: coating a photoresist layer on a structure layer to be patterned; exposing the photoresist layer using a mask plate; developing the exposed photoresist layer to obtain a photoresist pattern; etching the structure layer with the photoresist pattern, and optionally removing the photoresist pattern. The mask plate for example may be a single-tone or a dual-tone mask plate.

Prior to the preparation of the TFT array substrate, the substrate 1 may be cleaned firstly to remove dusts from the substrate 1 so as to prevent the prepared TFT from deterioration of performance caused by the dusts. The substrate 1 may be a plastic substrate or a glass substrate, wherein the glass substrate may be used for preparing a hard array substrate and the plastic substrate may be used for preparing a soft array substrate.

After completion of the cleaning, a poly-silicon layer is formed on the substrate 1, either by directly forming the poly-silicon layer on the substrate or by firstly forming an amorphous silicon (a-Si) layer on the substrate and then crystallizing the a-Si layer. The method of directly forming the poly-silicon layer or the a-Si layer may be chemical vapor deposition or the like. The method of crystallizing the a-Si layer may include solid phase crystallization (SPC), laser crystallization or metal induction crystallization (MIC) or the like.

After forming the poly-silicon layer, an active layer 2 is formed by a patterning process, which patterning process exemplarily includes the following steps:

S101. Coating photoresist on the substrate formed with the poly-silicon layer;

S102. Exposing and developing the substrate coated with the photoresist by a masking process so as to fiat in a photoresist pattern including a photoresist-completely-retained region and a photoresist-completely-removed region;

S103. Etching the poly-silicon layer in the photoresist-completely-removed region by an etching process, so as to form the active layer 2 of the poly-silicon TFT; and S104. Removing the remaining photoresist.

The schematic view of the formed structure is shown in FIG. 1.

S2. Forming a first insulating layer 3.

Figure 2:
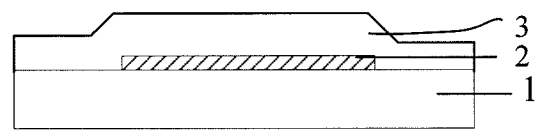

The first insulating layer 3 is formed on the substrate formed with the active layer. The first insulating layer 3 may be prepared by such a method as spin coating, chemical vapor deposition or the like. The schematic view of the formed structure is shown in FIG. 2.

S3. Forming a gate metal layer and forming a gate electrode 4 by a patterning process.

For example, the gate metal layer is formed on the substrate formed with the first insulating layer by a chemical vapor deposition or sputtering method.

The gate electrode 4 is formed by a patterning process, which patterning process exemplarily includes the following steps:

S301. Coating photoresist on the gate metal layer;

S302. Exposing and developing the substrate coated with the photoresist so as to form a photoresist pattern including a photoresist-completely-retained region and a photoresist-completely-removed region;

S303. Etching the gate metal layer of the photoresist-completely-removed region by an etching process so as to form the gate electrode 4; and S304. Removing the remaining photoresist.

Figure 3:
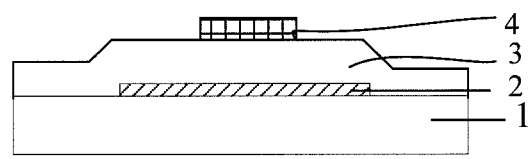

The schematic view of the formed structure is shown in FIG. 3.

S4. Forming a second insulating layer 5.

Figure 4:
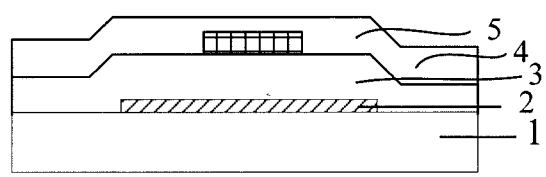

The second insulating layer 5 is formed on the substrate subjected to the step S3. The second insulating layer 5 may be prepared by such a method as spin coating, chemical vapor deposition or the like. The schematic view of the formed structure is shown in FIG. 4.

S5. Forming, by a patterning process, via holes at preset positions for forming source and drain electrodes in subsequent steps.

The via holes 6 is formed by a patterning process on the substrate subjected to the step S4, which patterning process exemplarily includes the following steps:

S501. Coating photoresist on the substrate subjected to the step S4;

S502. Exposing and developing the substrate coated with the photoresist by a masking process so as to form a photoresist pattern including a photoresist-completely-retained region and a photoresist-completely-removed region;

S503. Etching the first insulating layer 3 and the second insulating layer 5 of the photoresist-completely-removed region by an etching process, so as to form the via holes 6 penetrating through the first insulating layer 3 and the second insulating layer 5; and S504. Removing the remaining photoresist.

Figure 5:
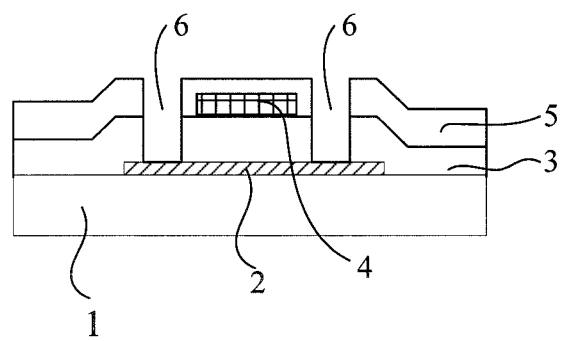

The schematic view of the formed structure is shown in FIG. 5.

S6. Doping the active layer through the via holes by a doping process to form a doped region 201.

Figure 6:
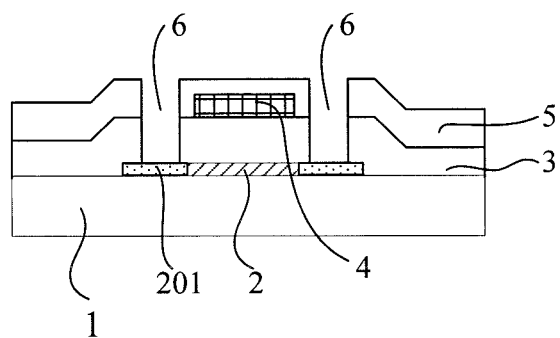

The doping process in the present step may be carried out by such a method as ion implantation or the like. The structure formed after doping is shown in FIG. 6.

S7. Forming a source-drain metal layer, and forming a source electrode and a drain electrode by a patterning process.

The source-drain metal layer is formed on the substrate subjected to the doping process, for example, by such a method as sputtering or the like. Afterwards a patterning process is adopted to form the source electrode and the drain electrode, which are connected to the doped regions of the active layer through the via holes formed in the step S5. The patterning process exemplarily includes the following steps:

S701. Coating photoresist on the substrate formed with the source-drain metal layer;

S702. Exposing and developing the substrate coated with the photoresist by a masking process so as to form a photoresist pattern including a photoresist-completely-retained region and a photoresist-completely-removed region;

S703. Etching the source-drain metal layer in the photoresist-completely-removed region by an etching process, so as to form a source electrode 7 and a drain electrode 8.

The aforesaid poly-silicon TFT may be an N-TFT or a P-TFT. When it is an N-TFT, the doped region may be an N-type doped region, and the doped elements may be one of P, As, and Sb, or a mixture thereof; when it is a P-TFT, the doped region may be a P-type doped region, and the doped elements may be one of B, and In, or a mixture thereof.

S704. Removing the remaining photoresist.

Figure 7:
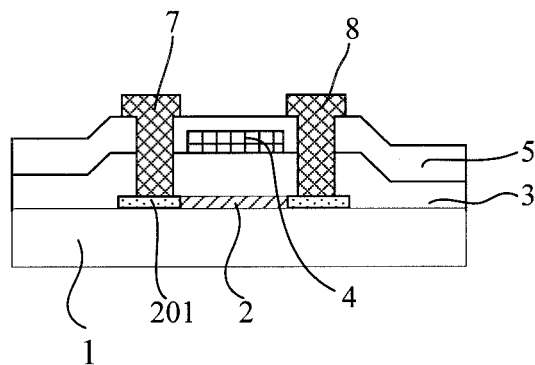

The schematic view of the formed structure is shown in FIG. 7.

Figure 8:
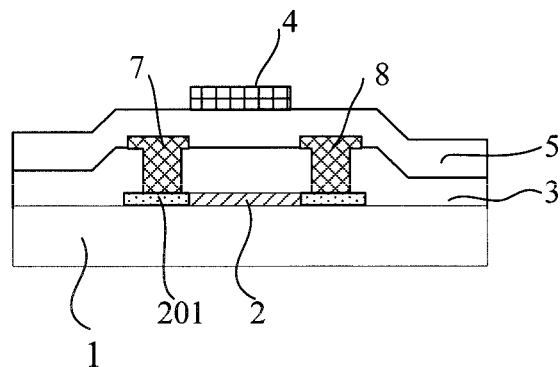
FIG. 8 is a cross-sectional schematic view of another poly-silicon TFT provided in an embodiment of the present invention.

In the present embodiment, the source electrode and the drain electrode of the TFT may also be prepared prior to the preparation of the gate electrode and the second insulating layer. The preparing method is same as that implemented in the aforesaid steps and is not dealt with herein. The formed structure is shown in FIG. 8.

In addition, the present embodiment further provides a poly-silicon TFT obtained by the aforesaid method of preparing the poly-silicon TFT. The structure of the poly-silicon TFT is shown in FIG. 7 or FIG. 8.

Corresponding to the poly-silicon TFT, the present embodiment further provides a poly-silicon array substrate comprising the aforesaid poly-silicon TFT. The poly-silicon array substrate may be applied to various display devices, for example, liquid crystal display device, organic light emitting diode (OLED) display device, e-paper display device and so on.

The poly-silicon TFT and the preparing method thereof are provided in the present embodiment by performing the doping process through via holes to form doped regions on both sides of the active layer and to form a corresponding TFT, thereby avoiding the requirement of dedicated mask plates for doping process, reducing the numbers of mask plates used for preparing the TFT array substrate, and lowering production costs.

Embodiment 2

Corresponding to the method of preparing a poly-silicon TFT, the present embodiment further provides a method of preparing a poly-silicon array substrate.

The array substrate in the embodiment of the present invention includes a plurality of gate lines and a plurality of data lines, which intersect each other to define pixel units arranged in a matrix, each of the pixel units comprising a thin film transistor as a switch element, and a pixel electrode. For example, the gate electrode of the thin film transistor of each pixel unit is electrically connected to or integrally formed with the corresponding gate line, the source electrode is electrically connected to or integrally formed with the corresponding data line, and the drain electrode is electrically connected to or integrally formed with the corresponding pixel electrode. The following description is mainly about one or more pixel units, but other pixel units may be formed similarly.

The poly-silicon array substrate of the present embodiment comprises an N-TFT including an N-type doped region and a P-TFT including a P-type doped region. The pixel region (display region) 2 of the array substrate and the peripheral driving region 3 at the periphery of the pixel region 2 may be respectively provided with an N-TFT and a P-TFT. The pixel region 2 and the peripheral driving region 3 may be formed with the poly-silicon TFTs of either the same type or the different types. In one application, a P-TFT is formed in the peripheral driving region 3 while an N-TFT is formed in the pixel region 2. The type and position of the TFT to be formed may be adjusted according to the practical needs and are not defined herein. The method of preparing the embodiment may comprise the following steps.

A1. Forming a poly-silicon layer on a substrate, forming an active layer by a patterning process, and doping the N-TFT or P-TFT active layer by a first doping process to form an N-type doped region or a P-type doped region.

The poly-silicon layer is formed on the substrate 1, either by directly forming the poly-silicon layer on the substrate or by firstly forming an amorphous silicon (a-Si) layer on the substrate before crystallizing the a-Si layer. The method of directly forming the poly-silicon layer or the a-Si layer may be chemical vapor deposition or the like. The method of crystallizing the a-Si layer may include solid phase crystallization (SPC), laser crystallization or metal induction crystallization (MIC) or the like.

Figure 9:
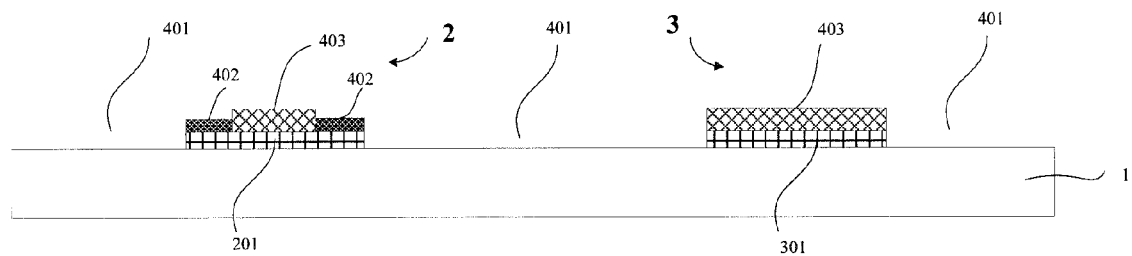
FIG. 9 to FIG. 18 are cross-sectional schematic views of the poly-silicon array substrate in each of the steps provided in an embodiment of the present invention.

The active layer is formed by a patterning process, which patterning process exemplarily includes the following steps:

A101. Coating photoresist on the substrate formed with the poly-silicon layer;

A102. Exposing and developing the substrate coated with the photoresist by a masking process so as to form a photoresist pattern including a photoresist-completely-retained region 403, a photoresist-partially-retained region 402 and a photoresist-completely-removed region 401; etching the poly-silicon layer in the photoresist-completelyremoved region 401 by an etching process, so as to form the active layer 201 of the N-TFT and the active layer 301 of the P-TFT, as shown in FIG. 9.

The masking process in the step A102 may be realized by using a dual-tone mask plate, for example, a half-tone mask plate, a grey-tone mask plate, or a single-slit mask plate.

A103. Removing the photoresist of the partially-retained region 402, which may be realized by an ashing process. In the present step, the photoresist-completely-retained region 403 may also be thinned and partially retained.

A104. Doping, using a doping process, the exposed active layer after the photoresist-partially-retained region 402 is removed in the step A103, so as to form a doped region 202.

Figure 10:
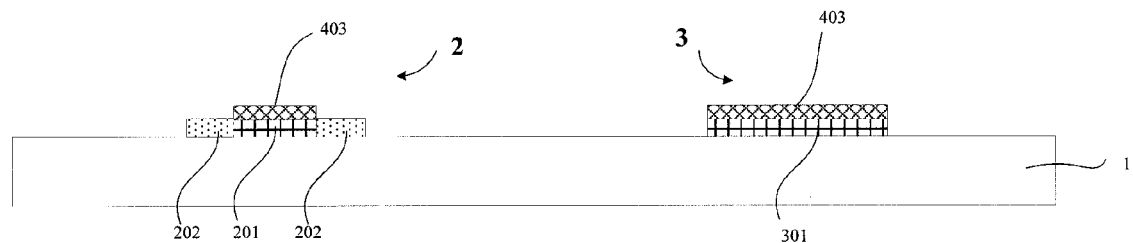

The doping process may adopt such a method as ion implantation or the like. If the N-type doped region is formed first, the doped elements in this step may be one of P, As, and Sb, or a mixture thereof; if the P-type doped region is formed first, the doped elements in this step may be one of B, and In, or a mixture thereof. The order of forming the P-type doped region and the N-type doped region does not affect the method provided in the present embodiment, as long as the doped elements are elements corresponding to the doped region. No more details are given here. The following steps are introduced by giving the example of forming the N-type doped region of N-TFT first. The formed structure is shown in FIG. 10.

A105. Removing the remaining photoresist to form an active layer 201 of N-TFT having an N-type doped region 202 and an active layer 301 of P-TFT.

Figure 11:
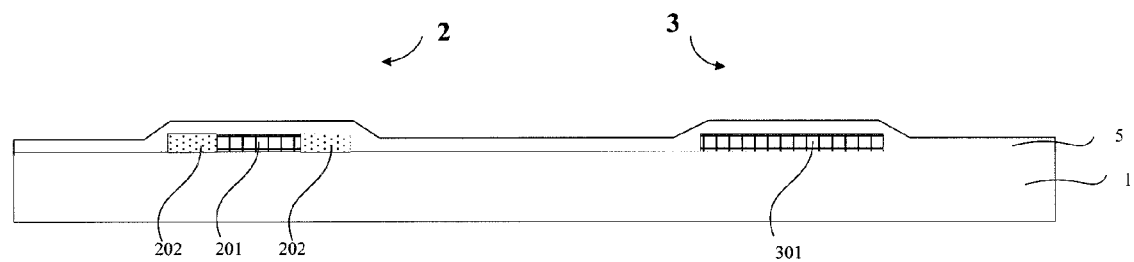

The formed structure is shown in FIG. 11.

A2. Forming a first insulating layer.

Figure 12:
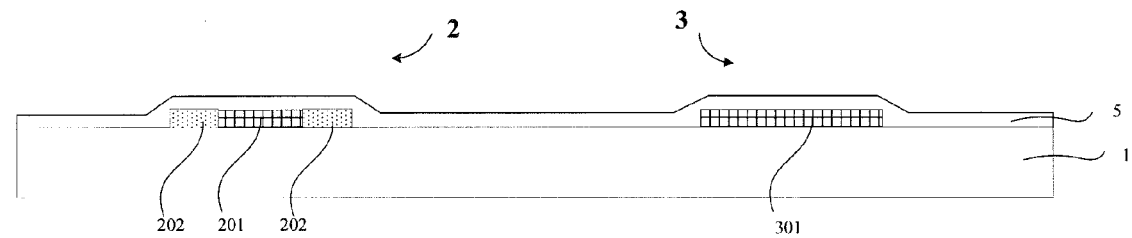

The first insulating layer 5 is formed on the substrate formed with the active layer. The first insulating layer 5 may be prepared by such a method as spin coating, chemical vapor deposition or the like. The schematic view of the formed structure is shown in FIG. 12.

A3. Forming a gate metal layer, and forming a gate electrode by a patterning process.

The gate metal layer is formed on the substrate formed with the first insulating layer 5 by a chemical vapor deposition or sputtering method. After the gate metal layer is formed, the gate electrode is formed by a patterning process, which patterning process exemplarily includes the following steps:

A301. Coating photoresist on the substrate formed with the gate metal layer;

A302. Exposing and developing the substrate coated with the photoresist by a masking process so as to form a photoresist pattern including a photoresist-completely-retained region and a photoresist-completely-removed region;

A303. Etching the gate metal layer of the photoresist-completely-removed region by an etching process so as to form the gate electrodes 203 and 303.

Figure 13:
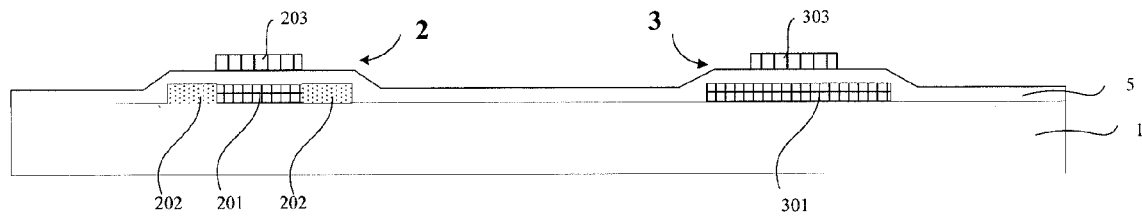

The formed structure is shown in FIG. 13.

A4. Forming a second insulating layer.

Figure 14:
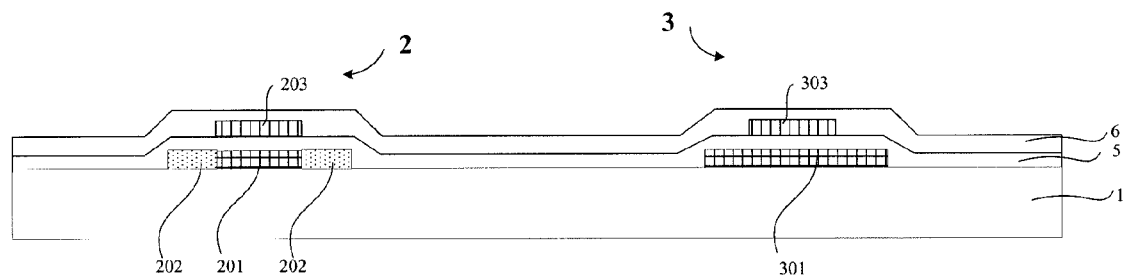

The second insulating layer 6 is formed on the substrate formed with the gate electrodes. The second insulating layer 6 may be prepared by such a method as spin coating or the like. The formed structure is shown in FIG. 14.

A5. Forming, by a patterning process, via holes at preset positions for forming source and drain electrodes of the N-TFT and source and drain electrodes of the P-TFT in subsequent steps, the source and drain electrodes of the N-TFT being connected through the via holes to the active layer of the N-TFT, and the source and drain electrodes of the P-TFT being connected through the via holes to the active layer of the P-TFT;

The patterning process exemplarily includes the following steps:

A501. Coating photoresist on the substrate formed with the second insulating layer;

A502. Exposing and developing the substrate coated with the photoresist by a masking process so as to form a photoresist pattern including a photoresist-completely-retained region and a photoresist-completely-removed region;

A503. Etching the first insulating layer and the second insulating layer of the photoresist-completely-removed region by an etching process, so as to form via holes 204, 205, 304 and 305 at preset positions for forming the source and drain electrodes of the N-TFT and the source and drain electrodes of the P-TFT in subsequent steps. The source and drain electrodes of the N-TFT are connected through the via holes 204 and 205 to the active layer of the N-TFT; the source and drain electrodes of the P-TFT are connected through the via holes 304 and 305 to the active layer of the P-TFT.

A504. Removing the remaining photoresist.

Figure 15:
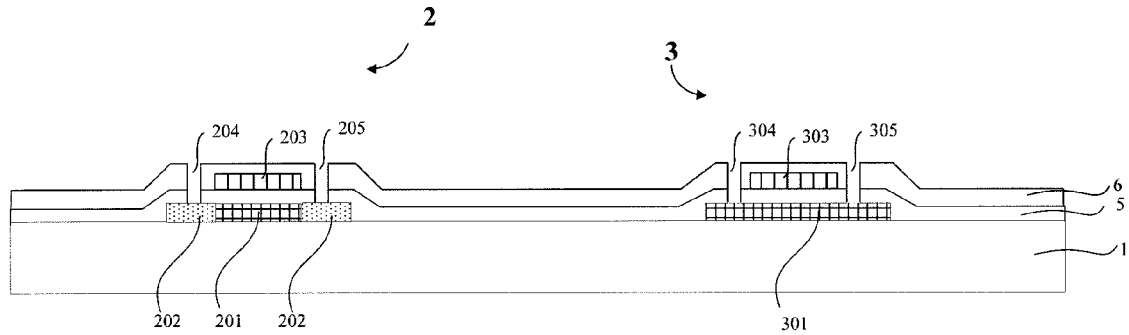

The formed structure is shown in FIG. 15.

Figure 16:
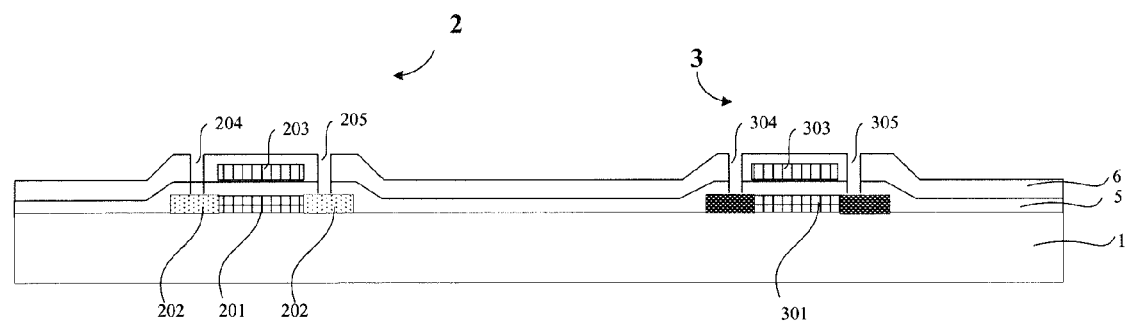

A6. Doping the active layer through the via holes by a second doping process, to form the P-type doped region or the N-type doped region. The formed structure is shown in FIG. 16.

The present step is introduced by giving the example of forming an N-type doped region in step A1 and forming a P-type doped region in the present step.

The second doping process may adopt such a method as ion implantation or the like. By making use of the barrier effect of the first insulating layer 5, the second insulating layer 6 and the gate electrodes 203, 303, the active layer of the P-TFT is doped via the via holes 304, 305 without using a mask plate, whereby the P-type doped region 302 is formed.

The doped elements in the P-type doped region 302 may be one of B, and In, or a mixture thereof.

When the second doping process is performed, since the N-type doped region 202 of the N-TFT also comprises via holes 204 and 205, the P-type doped elements may also enter the N-type doped region 202 through the via holes 204 and 205 while doping. So, the doping amount of the P-type doped element in the second doping process is smaller than the doping amount of the N-type doped element in the first doping process. The doping amount may be controlled specifically by controlling the conditions (e.g. voltage, ion beam distribution and etc.) of the doping process. In this case, although the P-type doped element may enter the N-type doped region 202 to be neutralized with the N-type doped element in the N-type doped region 202, the doped region 202 still presents N-type semiconductor properties because the doping amount of the P-type doped element is smaller than that of the N-type doped element.

Preferably, the doping amount of the second doping process may be ⅓~⅔ of the doping amount of the first doping process, and more preferably, the doping amount of the second doping process may be ½ of the doping amount of the first doping process. Under the preferable conditions, both the process flow and the costs of mask plate can be saved, while the good semiconductor properties of the N-type doped region and the P-type doped region can be ensured.

A7. Forming a source-drain metal layer, and forming the source and drain electrodes by a patterning process.

The source-drain metal layer is formed on the substrate subjected to the step A6 by a sputtering method, chemical vapor deposition or the like. The source and drain electrodes are formed on the substrate formed with the source-drain metal layer by a patterning process, which patterning process exemplarily includes the following steps:

A701. Coating photoresist on the substrate formed with the source-drain metal layer;

A702. Exposing and developing the substrate coated with the photoresist by a masking process so as to form a photoresist pattern including a photoresist-completely-retained region and a photoresist-completely-removed region;

A703. Etching the source-drain metal layer in the photoresist-completely-removed region by an etching process, so as to form source electrodes 206, 306 of the N-TFT and the P-TFT and drain electrodes 207, 307 of the N-TFT and the P-TFT; and A704. Removing the remaining photoresist.

Figure 17:
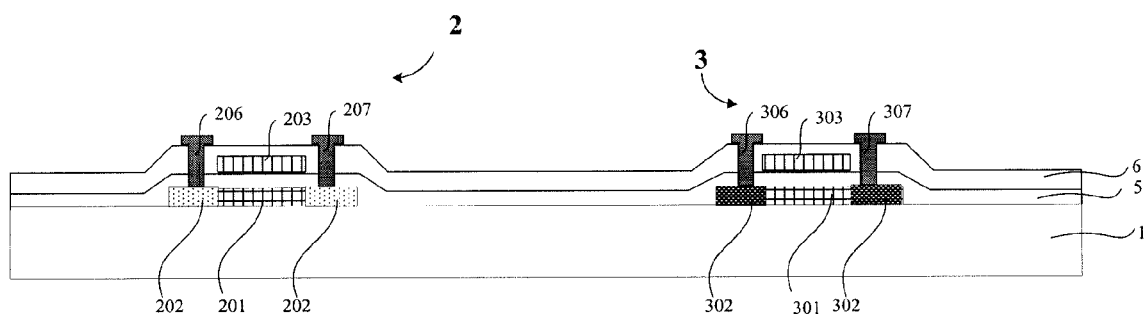

The formed structure is shown in FIG. 17.

The method of preparing the poly-silicon array substrate provided in the present embodiment may prepare the source and drain electrodes of the N-TFT and the P-TFT before preparing the second insulating layer, and then prepare the gate electrodes on the second insulating layer, which can achieve the same effect.

The method of preparing the array substrate may further comprise:

A8. Forming a transparent conductive layer, and forming a pixel electrode by a patterning process.

The transparent conductive layer is formed on the substrate formed with the source and drain electrodes by such a method as sputtering, chemical vapor deposition, or the like. The material for the transparent conductive layer may be selected from ITO, IZO and etc., and preferably an ITO material.

The pixel electrode is formed by a patterning process, which patterning process exemplarily includes the following steps.

A801. Coating photoresist on the substrate formed with the transparent conductive layer;

A802. Exposing and developing the substrate coated with the photoresist by a masking process so as to form a photoresist pattern including a photoresist-completely-retained region and a photoresist-completely-removed region;

A803. Etching the transparent conductive layer of the photoresist-completely-removed region by an etching process, so as to form a pixel electrode; and A804. Removing the photoresist of the completely-retained region.

Figure 18:
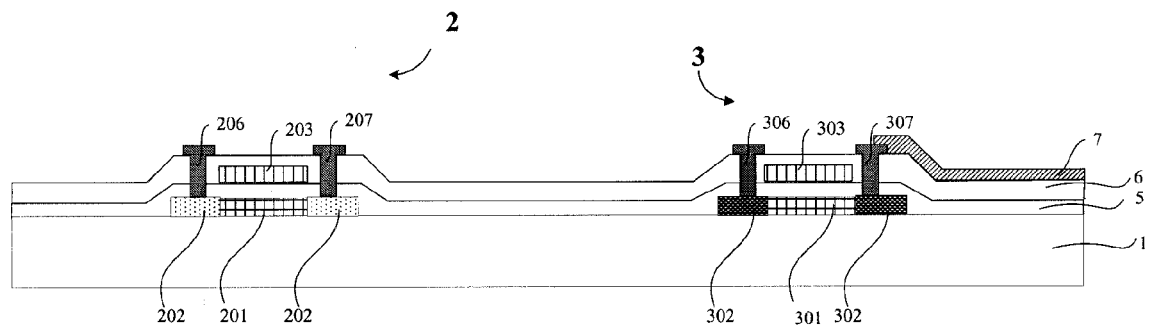

The formed structure is shown in FIG. 18.

Prior to the preparation of the pixel electrode, an insulating layer may be optionally prepared on the source and drain electrodes of the N-TFT and the P-TFT in order to protect the source and drain electrodes from being affected during the preparation of the pixel electrode. After the preparation of the insulating layer, via holes may be formed on the insulating layer, through which via holes the pixel electrode is connected to the drain electrode of the P-TFT.

Preferably, prior to the preparation of the poly-silicon layer, the method may further comprise:

A0. Forming a buffer layer on the substrate.

By preparing a buffer layer on the substrate, it can be avoided that the impurities in the substrate enter the poly-silicon layer to affect the performance of the TFT.

The present embodiment further provides a poly-silicon array substrate prepared by the aforesaid method.

The method of preparing the poly-silicon array substrate, the poly-silicon array substrate, the display panel and the display device are provided in the embodiments by performing the doping process through via holes to form doped regions on both sides of the active layer and to form a corresponding TFT, thereby avoiding the requirement of dedicated mask plates for doping process, reducing the numbers of mask plates used for preparing the TFT array substrate, and lowering production costs.

Corresponding to the poly-silicon array substrate, the embodiment further provides a display panel comprising said poly-silicon array substrate.

Corresponding to the display panel, the embodiment further provides a display device comprising said display panel, for example, liquid crystal display device, organic light emitting diode (OLED) display device, e-paper display device and etc. The display device comprises an array substrate according to any one of the aforesaid embodiments.

As for a liquid crystal display device, the array substrate and an opposed substrate are disposed opposite to each other so as to form a liquid crystal cell, and a liquid crystal material is filled in the liquid crystal cell. The opposed substrate is, for example, a color filter substrate. A pixel electrode in each pixel unit of the array substrate acts to apply an electric field to controlling the rotation degree of the liquid crystal material, so as to conduct a display operation. In another example, the liquid crystal display device further comprises a backlight source used to provide backlight for the array substrate.

As for an OLED display device, a pixel electrode in each pixel unit of the array substrate functions as an anode or a cathode for driving an organic light emitting material to emit light, so as to conduct display operation.

As for an e-paper display device, a pixel electrode in each pixel unit of the array substrate is used for driving the movement of e.g. the charged particles in electronic ink so as to realize the display of images.

The above embodiments of the present invention are given by way of illustration only and thus are not limitative of the protection scope of the present invention, which is determined by the attached claims.

The invention claimed is:

1. A method of preparing a poly-silicon thin film transistor (TFT) which comprises a doped region, comprising the following steps:

forming a poly-silicon layer on a substrate, and forming an active layer by a patterning process;

forming a first insulating layer covering the active layer;

forming, by a patterning process, via holes exposing the active layer in the first insulating layer at preset positions for forming a source electrode and a drain electrode in subsequent steps;

using only the first insulating layer having the via holes and directly contacting the active layer as a mask without using a photoresist mask, doping the active layer through the via holes by a doping process to form a doped region; and forming a source-drain metal layer, and forming the source electrode and the drain electrode by a patterning process, forming a second insulating layer entirely covering the source electrode, the drain electrode and the first insulating layer having the via holes; and forming a gate metal layer over the second insulating layer, and forming a gate electrode by a patterning process of the gate metal layer, wherein the second insulating layer is provided between the source and drain electrodes and the gate electrode and the via holes do not extend into the second insulating layer.

2. The method of preparing a poly-silicon TFT according to claim 1, further comprising:
 forming a gate metal layer, and forming a gate electrode by a patterning process; and
 forming a second insulating layer on the substrate formed with the gate electrode.

3. The method of preparing a poly-silicon TFT according to claim 1, wherein the poly-silicon TFT is an N-TFT, and the doped region is an N-type doped region.

4. The method of preparing a poly-silicon TFT according to claim 3, wherein the doped elements is one of P, As, and Sb, or a mixture thereof.

5. The method of preparing a poly-silicon TFT according to claim 1, wherein the poly-silicon TFT is a P-TFT, and the doped region is a P-type doped region.

6. The method of preparing a poly-silicon TFT according to claim 5, wherein the doped elements is one of B, and In, or a mixture thereof.

7. A poly-silicon TFT obtained by the preparing method according to claim 1.

8. A poly-silicon array substrate, which comprises the poly-silicon TFT according to claim 7.

9. A method of preparing a poly-silicon array substrate which comprises an N-TFT including an N-type doped region and a P-TFT including a P-type doped region, the method comprising the following steps:
 forming a poly-silicon layer on a substrate, forming an active layer by a patterning process, and doping the N-TFT or P-TFT active layer by a first doping process to form the N-type doped region or the P-type doped region;
 forming a first insulating layer covering the active layer;
 forming, by a patterning process, via holes in the first insulating layer at preset positions for forming source and drain electrodes of the N-TFT and source and drain electrodes of the P-TFT in subsequent steps;
 using only the first insulating layer having the via holes and directly contacting the active layer as a mask without using a photoresist mask, doping an exposed active layer region via the via holes by a second doping process, to form the P-type doped region or the N-type doped region, the element doping amount of the second doping process being smaller than that of the first doping process;
 forming a source-drain metal layer, and forming the source electrode and the drain electrode by a patterning process;
 forming a second insulating layer entirely covering the source electrode, the drain electrode and the first insulating layer having the via holes; and
 forming a gate metal layer over the second insulating layer, and forming a gate electrode by a patterning process of the gate metal layer,
 wherein the second insulating layer is provided between the source and drain electrodes and the gate electrode and the via holes do not extend into the second insulating layer.

10. The method of preparing a poly-silicon array substrate according to claim 9, further comprising:
 forming a gate metal layer, and forming a gate electrode by a patterning process; and
 forming a second insulating layer on the substrate formed with the gate electrode.

11. The method of preparing a poly-silicon array substrate according to claim 10, wherein the element doping amount of the second doping process is ⅓~⅔ of the element doping amount of the first doping process.

12. The method of preparing a poly-silicon array substrate according to claim 11, wherein the element doping amount of the second doping process is ½ of the element doping amount of the first doping process.

13. The method of preparing a poly-silicon array substrate according to claim 10, wherein the patterning process includes a half-tone masking process, a grey-tone masking process, or a single-slit masking process in the steps of forming the poly-silicon layer on the substrate, forming the active layer by the patterning process, doping the N-TFT or P-TFT active layer by the first doping process to form the N-type doped region or the P-type doped region.

14. The method of preparing a poly-silicon array substrate according to claim 10, further comprising:
 forming a third insulating layer, and forming, by a patterning process, via holes at positions where a pixel electrode is connected to the drain electrode of the P-TFT in the subsequent steps.

15. The method of preparing a poly-silicon array substrate according to claim 10, further comprising: forming a transparent conductive layer, and forming a pixel electrode by a patterning process.

16. The method of preparing a poly-silicon array substrate according to claim 10, further comprising: forming a buffer layer on the substrate prior to forming the poly-silicon layer.

17. The method of preparing a poly-silicon array substrate according to claim 10, wherein the doped elements in the N-type doped region of the N-TFT is one of P, As, and Sb, or a mixture thereof.

18. The method of preparing a poly-silicon array substrate according to claim 10, wherein the doped elements in the P-type doped region of the P-TFT is one of B, and In or a mixture thereof.

19. A poly-silicon array substrate obtained by a preparing method according to claim 9.

20. A display device, comprising a poly-silicon array substrate according to claim 19.

* * * * *